United States Patent
Nakayama et al.

(10) Patent No.: US 11,879,948 B2
(45) Date of Patent: Jan. 23, 2024

(54) ELECTRICAL FAULT DETECTION DEVICE AND VEHICLE POWER SUPPLY SYSTEM

(71) Applicant: SANYO Electric Co., Ltd., Osaka (JP)

(72) Inventors: Masato Nakayama, Hyogo (JP); Tomonori Kunimitsu, Hyogo (JP); Taisuke Hamada, Hyogo (JP); Yasuharu Tanaka, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 261 days.

(21) Appl. No.: 17/427,990

(22) PCT Filed: Dec. 9, 2019

(86) PCT No.: PCT/JP2019/048018
§ 371 (c)(1),
(2) Date: Aug. 3, 2021

(87) PCT Pub. No.: WO2020/170556
PCT Pub. Date: Aug. 27, 2020

(65) Prior Publication Data
US 2022/0120823 A1    Apr. 21, 2022

(30) Foreign Application Priority Data
Feb. 19, 2019    (JP) ................................ 2019-027441

(51) Int. Cl.
*G01R 31/52*    (2020.01)
*G01R 19/00*    (2006.01)
*G01R 31/00*    (2006.01)

(52) U.S. Cl.
CPC ......... *G01R 31/52* (2020.01); *G01R 19/0084* (2013.01); *G01R 31/006* (2013.01)

(58) Field of Classification Search
CPC ..... G01R 31/006; G01R 31/52; B60L 3/0023; B60L 3/0046; B60L 3/0069; H02H 3/05
See application file for complete search history.

(56) References Cited

U.S. PATENT DOCUMENTS

| | | | |
|---|---|---|---|
| 2007/0285057 A1* | 12/2007 | Yano ......................... | B60L 3/12 320/116 |
| 2011/0080676 A1* | 4/2011 | Yoshida ................. | G01R 31/52 361/30 |

(Continued)

FOREIGN PATENT DOCUMENTS

| | | |
|---|---|---|
| DE | 572334 C | 3/1933 |
| GB | 2556129 A | 5/2018 |

(Continued)

OTHER PUBLICATIONS

International Search Report of PCT application No. PCT/JP2019/048018 dated Feb. 4, 2020.

(Continued)

*Primary Examiner* — Dominic E Hawkins
(74) *Attorney, Agent, or Firm* — WHDA, LLP

(57) ABSTRACT

In electrical fault detection device that is mounted on a vehicle and includes: energy storage unit to be mounted in a state of being insulated from a chassis ground of the vehicle; first switch inserted into positive wire; and second switch inserted into negative wire, in order to suppress a total cost by not using an expensive component while securing detection accuracy, electrical fault detection device further includes coupling capacitor, AC output unit, first voltage measurement unit, first determination unit, voltage dividing circuit, second voltage measurement unit, and second determination unit. Voltage dividing circuit is connected between positive wire between first switch and one end of load and negative wire between second switch and the other end of load.

7 Claims, 5 Drawing Sheets

(56) References Cited

U.S. PATENT DOCUMENTS

2012/0250203 A1* 10/2012 Makihara ........... G01R 31/3835
324/750.01
2015/0054516 A1 2/2015 Iisaka
2020/0049768 A1 2/2020 Matsukawa et al.

FOREIGN PATENT DOCUMENTS

| JP | 2003-250201 | 9/2003 | | |
|---|---|---|---|---|
| JP | 2007-327856 | 12/2007 | | |
| JP | 2013-207961 A | 10/2013 | | |
| JP | 2014-149276 A | 8/2014 | | |
| JP | 2018-026888 A | 2/2018 | | |
| JP | 2018-179835 A | 11/2018 | | |
| JP | 2018-196285 A | 12/2018 | | |
| WO | WO-2019176173 A1 * | 9/2019 | ............. | G01R 31/52 |

OTHER PUBLICATIONS

Extended (Supplementary) European Search Report dated Mar. 14, 2022, issued in counterpart EP application No. 19916528.3. (13 pages).
Office Action dated Sep. 4, 2023, issued in counterpart IN application No. 202147036075. (8 pages).

* cited by examiner

ELECTRICAL FAULT DETECTION DEVICE AND VEHICLE POWER SUPPLY SYSTEM

CROSS-REFERENCE TO RELATED APPLICATIONS

This application is a U.S. national stage application of the PCT International Application No. PCT/JP2019/048018 filed on Dec. 9, 2019, which claims the benefit of foreign priority of Japanese patent application No. 2019-027441 filed on Feb. 19, 2019, the contents all of which are incorporated herein by reference.

TECHNICAL FIELD

The present invention relates to an electrical fault detection device which detects a ground fault of a load in a vehicle insulated from a chassis ground, and a vehicle power supply system.

BACKGROUND ART

In recent years, hybrid vehicles (HV), plug-in hybrid vehicles (PHV), and electric vehicles (EV) have become widespread. In these electrically operated vehicles, a high-voltage driving battery (traction battery) is mounted in addition to an accessory battery (generally, a lead battery having an output of 12 V). In order to prevent an electric shock, a high-voltage circuit which includes a high-voltage driving battery, an inverter, and a traveling motor is insulated from a body (chassis ground) of a vehicle.

A Y capacitor is inserted between a positive wire of a high-voltage circuit on a vehicle side and a chassis ground, and a Y capacitor is inserted between a negative wire of the high-voltage circuit on the vehicle side and the chassis ground. Accordingly, electricity can be stably supplied from the high-voltage driving battery to a load on the vehicle side. An electrical fault detection device which detects a ground fault by monitoring an insulation resistance between a high-voltage circuit and a chassis ground is mounted on the vehicle.

The ground fault detection method is roughly classified into an AC method and a DC method. In an electrical fault detection device adopting the AC method, a pulse voltage is applied to a positive electrode terminal or a negative electrode terminal of a driving battery via a resistor and a coupling capacitor, and a voltage at a connecting point between the resistor and the coupling capacitor is measured, thereby detecting whether or not the electric power is leaked (see, for example, PTL 1).

An electrical fault detection device adopting the DC method connects a resistance voltage dividing circuit between a positive wire and a negative wire of a high-voltage circuit, and determines whether or not the electric power is leaked based on a ratio between a divided voltage and a total voltage of a driving battery (see, for example, PTL 2). In a general electrically operated vehicle, a high-voltage driving battery and a high-voltage vehicle load including an inverter are connected via a contactor. The resistance voltage dividing circuit is usually connected to a battery side with respect to the contactor.

CITATION LIST

Patent Literature

PTL 1: Unexamined Japanese Patent Publication No. 2003-250201

PTL 2: Unexamined Japanese Patent Publication No. 2007-327856

SUMMARY OF THE INVENTION

In the above configuration of the electrical fault detection device adopting the AC method, when a total voltage of the driving battery fluctuates, a fluctuation amount is superposed on a measured pulse voltage and hence, it is difficult to accurately determine whether or not the electric power is leaked. In order to prevent a measured pulse voltage from being affected by the fluctuation of a load on a vehicle side, countermeasures can be considered such as the insertion of a band pass filter or the determination based on a peak-to-peak value of a measured voltage. However, these countermeasures make the circuit configuration complicated. In addition, it is necessary to appropriately adjust a capacitance of a coupling capacitor and a frequency of a pulse voltage to be applied depending on a capacitance of a Y capacitor connected between a wire of a high-voltage circuit on a vehicle side and a chassis ground. Accordingly, restriction is imposed on designing of an electrical fault detection device due to the Y capacitor. Specifically, it is necessary to design the capacitance of the coupling capacitor such that the capacitance is sufficiently larger than a capacitance of the Y capacitor.

In the above configuration of the electrical fault detection device adopting the DC method, to prevent a current from flowing from a driving battery to the above-mentioned resistance voltage dividing circuit at the time of bringing the contactor in an open state, it is necessary to connect a switch having high insulation performance (for example, a photo metal oxide semiconductor (MOS) relay) in a resistance voltage dividing circuit. A switch having high insulation performance is expensive and hence, the use of such a switch has been a factor which pushes up a cost of the electrical fault detection device.

In both of the configuration of the electrical fault detection device adopting the AC method and the configuration of the electrical fault detection device adopting the DC method, it is necessary for the electrical fault detection device to additionally include a welding detection circuit in order to determine the presence or absence of welding of the contactor.

The present invention has been made in view of such circumstances, and it is an object of the present invention to provide a technique which can suppress a total cost for manufacturing an electrical fault detection device mounted on a vehicle by not using an expensive component while securing detection accuracy.

In order to solve the above problems, according to an aspect of the present invention, there is provided an electrical fault detection device mounted on a vehicle that includes: an energy storage unit that is mounted on the vehicle in a state where the energy storage unit is insulated from a chassis ground of the vehicle and supplies electric power to a load in the vehicle; a first switch that is inserted into a positive wire to which a positive electrode of the energy storage unit and one end of the load are connected; and a second switch that is inserted into a negative wire to which a negative electrode of the energy storage unit and another end of the load are connected, wherein the electrical fault detection device comprises: a coupling capacitor that has one end connected to a current path of the energy storage unit; an AC output unit that applies a predetermined AC voltage to the other end of the coupling capacitor via an impedance element; a first voltage measurement unit that measures a voltage at a connecting point between the coupling capacitor and the impedance element; a first determination unit that determines whether or not the electric power is leaked based on a voltage detected by the first voltage measurement unit; a voltage dividing circuit that includes a first resistor, a second resistor, a third resistor, and a fourth resistor connected in series between the positive wire and the negative wire, the voltage dividing circuit having a connecting point positioned between the second resistor and the third resistor and connected to the chassis ground; a second voltage measurement unit that detects a potential at a connecting point between the first resistor and the second resistor, a potential at a connecting point between the third resistor and the fourth resistor, or a potential difference between the potentials; and a second determination unit that determines presence or absence of an electrical fault whether or not the electric power is leaked based on the potential or the potential difference detected by the second voltage measurement unit. The voltage dividing circuit is connected between the positive wire between the first switch and one end of the load and the negative wire between the second switch and another end of the load.

According to the present invention, in the electrical fault detection device mounted on the vehicle, it is possible to suppress the total cost for manufacturing the electrical fault detection device by not using an expensive component while securing the detection accuracy.

DESCRIPTION OF EMBODIMENT

Figure 1:
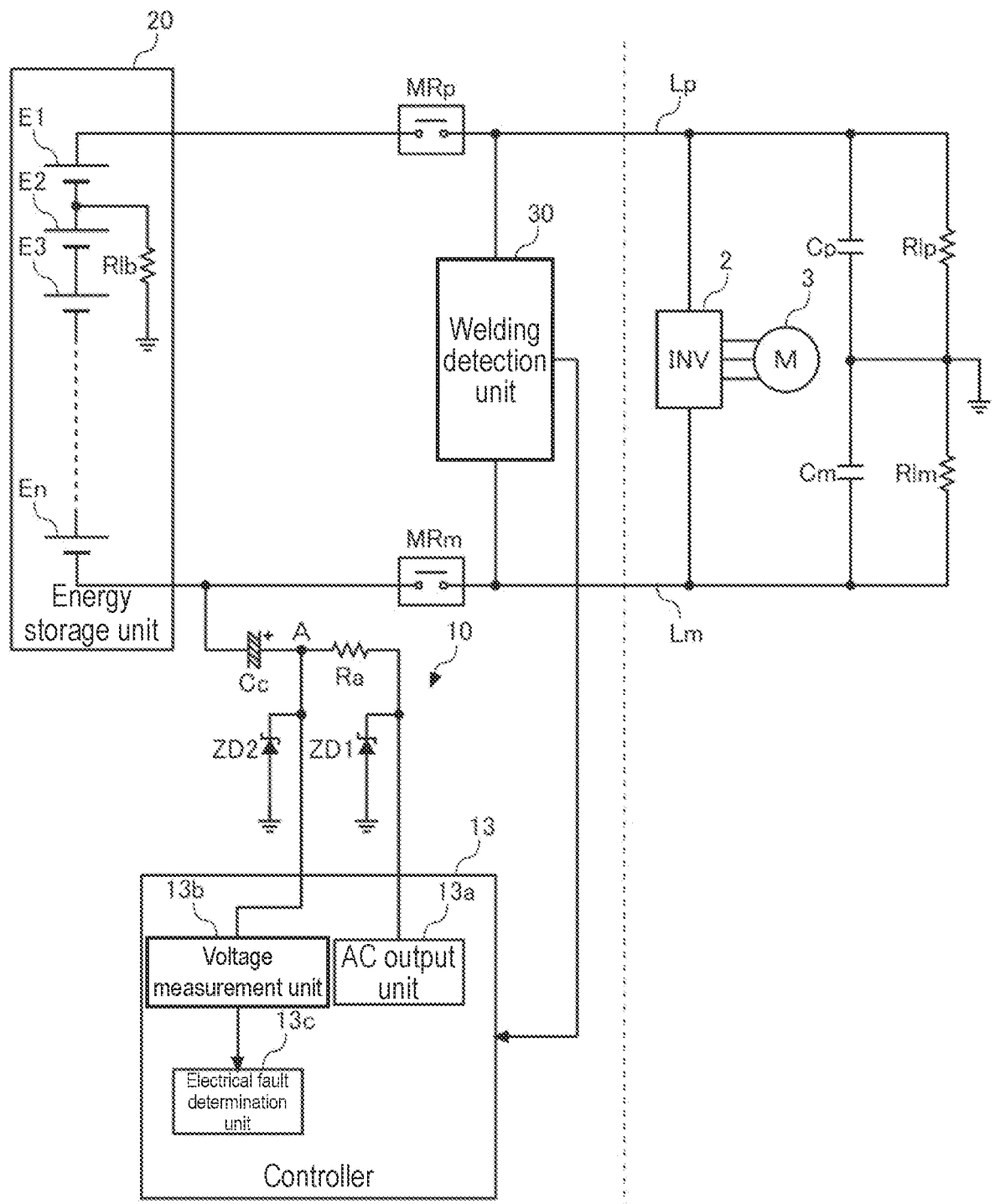
FIG. 1 is a block diagram for describing a configuration of a power supply system including an electrical fault detection device adopting an AC method according to a first comparative example.

FIG. 1 is a block diagram for describing a configuration of power supply system 5 which includes electrical fault detection device 10 adopting an AC method according to first comparative example. Power supply system 5 is mounted on an electrically operated vehicle. Power supply system 5 is provided separately from an accessary battery (typically, a lead battery having an output of 12 V being used) in an electrically operated vehicle. Power supply system 5 includes high-voltage energy storage unit 20 and electrical fault detection device 10. Energy storage unit 20 includes a plurality of cells E1 to En connected in series. As the cell, a lithium ion battery cell, a nickel hydrogen battery cell, a lead battery cell, an electric double layer capacitor cell, a lithium ion capacitor cell, or the like can be used. Hereinafter, an example where lithium ion battery cells (nominal voltage: 3.6 to 3.7 V) are used is assumed in the present specification.

An electrically operated vehicle includes inverter 2 and motor 3 as high-voltage loads. A positive electrode of energy storage unit 20 and one end of inverter 2 are connected to each other by positive wire Lp, and a negative electrode of energy storage unit 20 and the other end of inverter 2 are connected to each other by negative wire Lm. Positive side main relay MRp is inserted into positive wire Lp, and negative side main relay MRm is inserted into negative wire Lm. Positive side main relay MRp and negative side main relay MRm function as contactors that control conduction/disconnection between energy storage unit 20 and high-voltage loads in the electrically operated vehicle. In place of these relays, semiconductor switches having a high withstand voltage and high insulation can be used.

Inverter 2 is a bidirectional inverter that is connected between energy storage unit 20 and motor 3. During power running, inverter 2 converts DC power supplied from energy storage unit 20 into AC power and supplies the AC power to motor 3. During regeneration, inverter 2 converts AC power supplied from motor 3 into DC power and supplies the DC power to energy storage unit 20. For example, a three-phase AC motor is used as motor 3. Motor 3 rotates corresponding to AC power supplied from inverter 2 during power running. During regeneration, rotational energy generated by deceleration is converted into AC power and the AC power is supplied to inverter 2.

Energy storage unit 20 is mounted on the electrically operated vehicle in a state where energy storage unit 20 is insulated from a chassis ground of the electrically operated vehicle. An accessary battery is mounted on the electrically operated vehicle in a state where the negative electrode is electrically conductive with the chassis ground. Positive wire Lp close to inverter 2 with respect to positive side main relay MRp and the chassis ground are connected to each other via positive side Y capacitor Cp. Negative wire Lm close to inverter 2 with respect to negative side main relay MRm and the chassis ground are connected to each other via negative side Y capacitor Cm. Positive side Y capacitor Cp has a function of galvanically insulating positive wire Lp and the chassis ground from each other and a function of stabilizing a voltage of positive wire Lp. Negative side Y capacitor Cm has a function of galvanically insulating negative wire Lm and the chassis ground from each other and a function of stabilizing a voltage of negative wire Lm.

When energy storage unit 20 is ideally insulated from the chassis ground, an intermediate voltage of energy storage unit 20 is maintained around a voltage of the chassis ground. For example, when a voltage across terminals of energy storage unit 20 is 400 V, a positive electrode potential of energy storage unit 20 is maintained around +200 V, and a negative electrode potential is maintained around −200 V. When a human touches an exposed conductive unit of the electrically operated vehicle in a state where high-voltage energy storage unit 20 and the chassis ground are electrically conductive with each other, there is a risk that the human receives an electric shock. In view of the above, in the electrically operated vehicle on which high-voltage energy storage unit 20 is mounted, it is necessary to mount electrical fault detection device 10 on the electrically operated vehicle so as to monitor an insulation state between a high-voltage vehicle load including inverter 2 and the chassis ground. In FIG. 1, an insulation state between positive wire Lp and the chassis ground is expressed as positive side electrical fault resistance Rlp, and an insulation state between negative wire Lm and the chassis ground is expressed as negative side electrical fault resistance Rlm.

Electrical fault detection device 10 mainly includes coupling capacitor Cc, resistor Ra, and control unit 13. Control unit 13 includes AC output unit 13a, voltage measurement unit 13b, and electrical fault determination unit 13c. Control unit 13 may include, for example, a microcomputer and a nonvolatile memory (for example, an electrically erasable programmable read-only memory (EEPROM) or a flash memory).

One end of coupling capacitor Cc is connected to a current path of energy storage unit 20. In the example illustrated in FIG. 1, one end of coupling capacitor Cc is connected to the negative electrode of energy storage unit 20. One end of coupling capacitor Cc may be connected to the positive electrode of energy storage unit 20, or may be connected to a node of any of the plurality of cells E1 to En in energy storage unit 20. The other end of coupling capacitor Cc is connected to an AC output terminal of control unit 13 via resistor Ra. In place of resistor Ra, another impedance element may be used. A connecting point (measurement point A) between coupling capacitor Cc and resistor Ra is connected to a measurement voltage input terminal of control unit 13.

First Zener diode ZD1 is connected between a connecting point between resistor Ra and an AC output terminal of control unit 13 and the chassis ground. Second Zener diode ZD2 is connected between measurement point A and the chassis ground. First Zener diode ZD1 and second Zener diode ZD2 prevent an overvoltage from being applied to control unit 13 due to opening or closing of main relay MRp or MRm or the fluctuation of a load of power supply system 5. First Zener diode ZD1 and second Zener diode ZD2 also protect control unit 13 from a surge current and static electricity.

As coupling capacitor Cc, an aluminum electrolytic capacitor whose capacity can be relatively inexpensively increased is popularly used. Coupling capacitor Cc may be formed by connecting a plurality of capacitors (for example, aluminum electrolytic capacitors) in series. In this case, even if a short-circuit failure occurs in one capacitor, insulation can be maintained by the remaining capacitors.

AC output unit 13a applies a predetermined AC voltage to the other end of coupling capacitor Cc via resistor Ra. AC output unit 13a includes a local oscillator. AC output unit 13a shapes a rectangular wave pulse generated by the local oscillator into a rectangular wave pulse signal having a preset frequency and a preset duty ratio, and outputs the shaped rectangular wave pulse signal. Voltage measurement unit 13b measures a voltage at measurement point A. When an A/D converter is not incorporated in control unit 13, an A/D converter (not illustrated) is provided between measurement point A and voltage measurement unit 13b, and the A/D converter converts an analog voltage at measurement point A into a digital value and outputs the digital value to voltage measurement unit 13b.

Electrical fault determination unit 13c determines whether or not the electric power is leaked by comparing the voltage at measurement point A measured by voltage measurement unit 13b with a set value. Electrical fault determination unit 13c determines whether or not the electric power is leaked based on a degree of rounding of the applied rectangular wave pulse signal.

Figure 2:
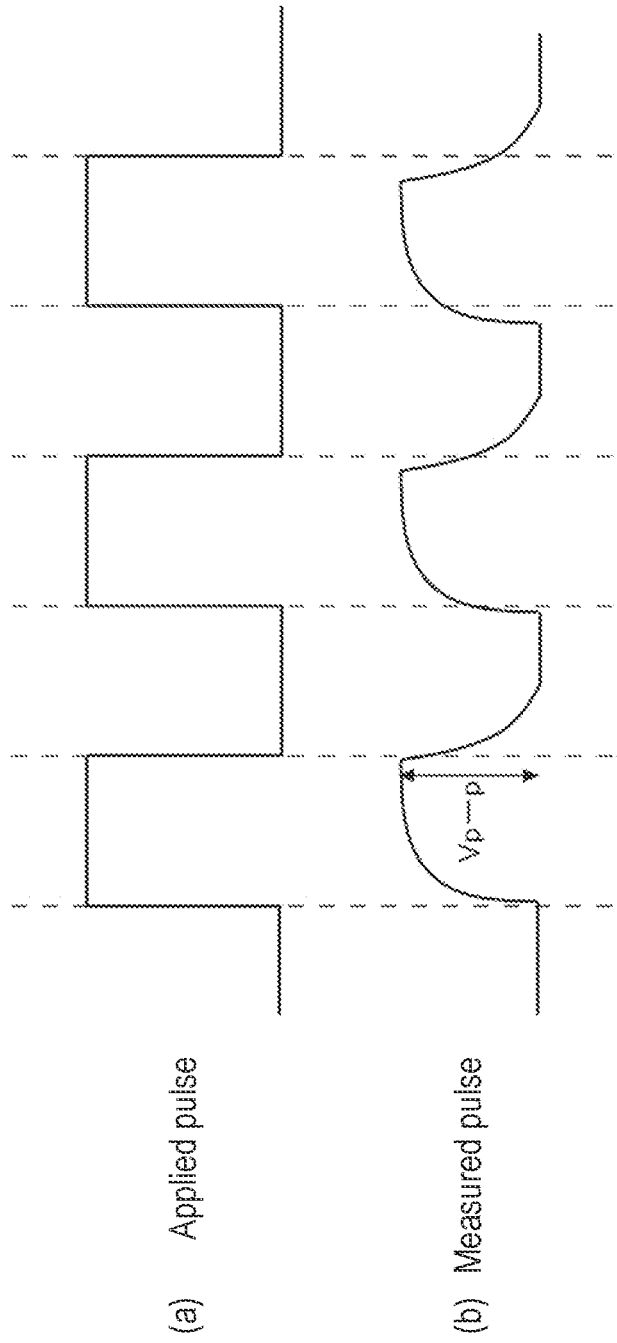
FIGS. 2(a) and 2(b) are diagrams illustrating an example of a waveform of a rectangular wave pulse applied from an AC output unit to a measurement point A, and an example of a voltage waveform at the measurement point A measured by a voltage measurement unit, respectively.

FIGS. 2(a) and 2(b) are diagrams illustrating an example of a waveform of a rectangular wave pulse applied from AC output unit 13a to measurement point A, and an example of a voltage waveform at measurement point A measured by voltage measurement unit 13b, respectively. Electrical fault determination unit 13c calculates a differential voltage Vp–p between a voltage at measurement point A sampled at the timing immediately before a rising edge of a waveform of an applied rectangular wave pulse and a voltage at measurement point A sampled at the timing immediately before a falling edge of the waveform of the applied rectangular wave pulse. When calculated differential voltage Vp–p is lower than a set value, electrical fault determination unit 13c determines whether or not the electric power is leaked. When the electric power is leaked, the rounding of the waveform of the applied rectangular wave pulse increases. A decrease in the calculated differential voltage Vp–p means that the rounding of the waveform of the rectangular wave pulse increases. The set value is determined based on the rounding of the waveform of the rectangular wave pulse at the time of occurrence of the electrical fault derived in advance by an experiment or simulation carried out by a designer.

The example illustrated in FIG. 1 illustrates a state where the electric power is leaked between a node between first cell E1 and second cell E2 in energy storage unit 20 and a chassis ground. Also in this case, the rounding of the waveform of the applied rectangular wave pulse increases.

Welding detection unit 30 detects a potential difference between a potential of positive wire Lp between positive side main relay MRp and one end of inverter 2 and a potential of negative wire Lm between negative side main relay MRm and the other end of inverter 2, and outputs the potential difference to control unit 13. Control unit 13 detects the welding of positive side main relay MRp or negative side main relay MRm based on the potential difference input from welding detection unit 30.

When a significant potential difference is detected by welding detection unit 30 in a state where inverter 2 is stopped and an OFF signal (open signal) is supplied to positive side main relay MRp, control unit 13 determines that positive side main relay MRp is welded. When a significant potential difference is detected by welding detection unit 30 in a state where inverter 2 is stopped and an OFF signal (open signal) is supplied to negative main relay MRm, control unit 13 determines that negative side main relay MRm is welded.

Figure 3:
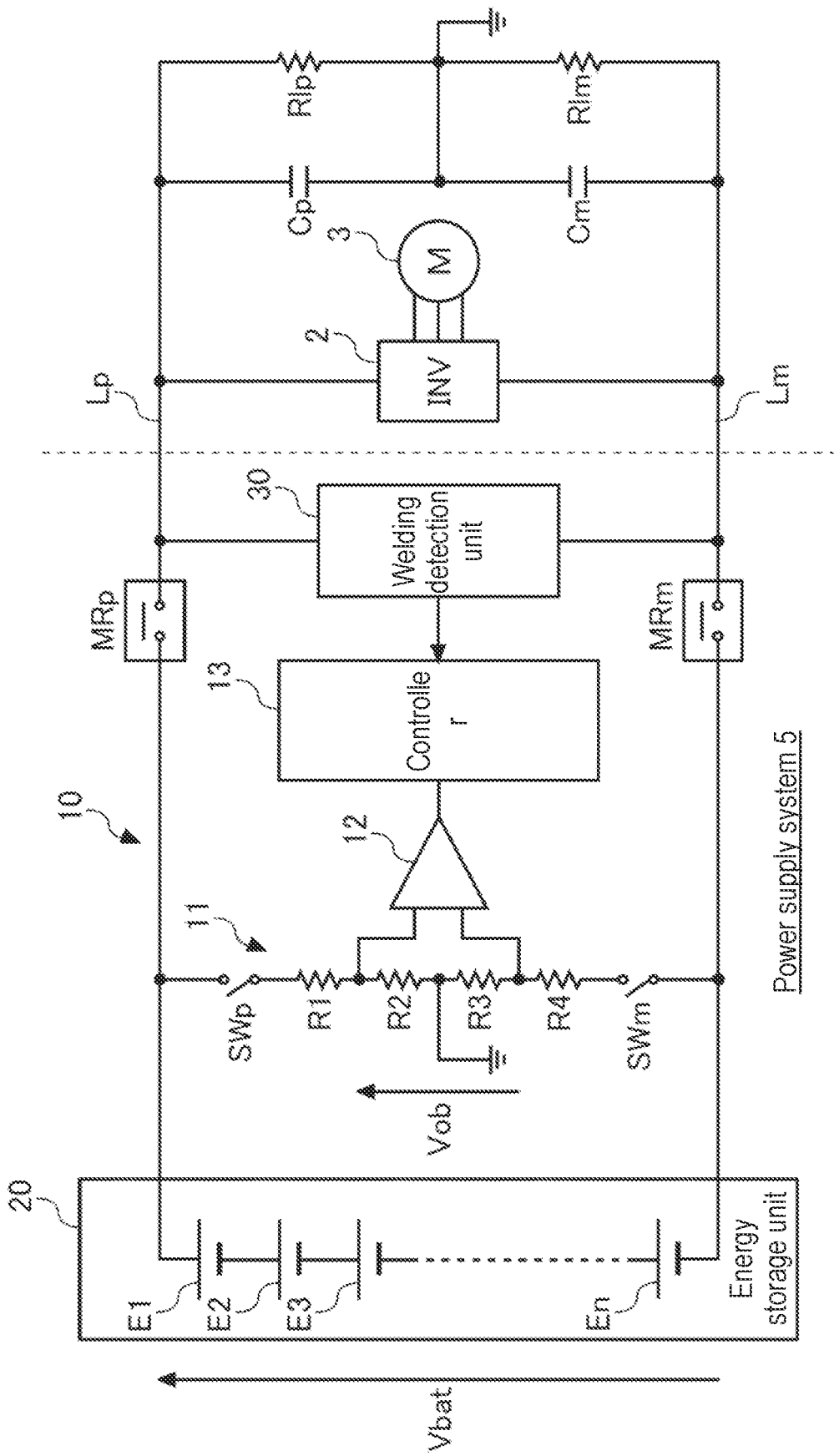
FIG. 3 is a block diagram for describing a configuration of a power supply system including an electrical fault detection device adopting a DC method according to a second comparative example.

FIG. 3 is a block diagram for describing a configuration of power supply system 5 including electrical fault detection device 10 adopting a DC method according to a second comparative example. Electrical fault detection device 10 according to the second comparative example includes voltage dividing circuit 11, voltage measurement unit 12, and control unit 13. Voltage dividing circuit 11 includes, between positive wire Lp and negative wire Lm, positive side voltage dividing switch SWp, first resistor R1, second resistor R2, third resistor R3, fourth resistor R4, and negative side voltage dividing switch SWm that are connected in series. A connecting point between second resistor R2 and third resistor R3 is connected to the chassis ground. In the second comparative example, voltage dividing circuit 11 is connected between positive wire Lp provided between positive side main relay MRp and positive electrode of energy storage unit 20 and negative wire Lm provided between negative side main relay MRm and a negative electrode of energy storage unit 20.

Voltage measurement unit 12 measures voltage Vob between a potential at a connecting point between first resistor R1 and second resistor R2 (hereinafter, referred to as a first connecting point) and a potential at a connecting point between third resistor R3 and fourth resistor R4 (hereinafter, referred to as a second connecting point). In the example illustrated in FIG. 3, voltage measurement unit 12 is configured with a differential amplifier. The differential amplifier outputs voltage Vob between the first connecting point and the second connecting point to control unit 13.

Control unit 13 determines whether or not the electric power is leaked based on voltage Vob measured by voltage measurement unit 12. Hereinafter, the description is made with respect to a method for determining whether or not the electric power is leaked between a high-voltage vehicle load including inverter 2 and chassis ground. First, control unit 13 performs a control so as to bring positive side main relay MRp and negative side main relay MRm into an ON state (closed state). When positive side main relay MRp and negative side main relay MRm are controlled by an electronic control unit (ECU) on a vehicle, control unit 13 instructs the ECU to turn on positive side main relay MRp and negative side main relay MRm via an in-vehicle network (for example, a controller area network (CAN)). When the ECU receives the instruction, the ECU turns on positive side main relay MRp and negative side main relay MRm. In a case where positive side main relay MRp and negative side main relay MRm are already brought into an ON state by a control performed by the ECU, control unit 13 does not need to give an instruction to turn on these relays. When positive side main relay MRp and negative side main relay MRm are in an ON state, control unit 13 performs a control so as to bring positive side voltage dividing switch SWp and negative side main relay MRm into an ON state.

The description is made hereinafter on a premise that resistance values of first resistor R1, second resistor R2, third resistor R3, and fourth resistor R4 are equal.

Control unit 13 estimates, as expressed by following equation 1, total voltage Vbat of energy storage unit 20 based on voltage Vob measured by voltage measurement unit 12, and a ratio between a combined resistance value of first resistor R1, second resistor R2, third resistor R3, and fourth resistor R4 and a combined resistance value of second resistor R2 and third resistor R3.

$$Vbat=(R1+R2+R3+R4)/(R2+R3)\cdot Vob \quad \text{(Equation 1)}$$

Control unit 13 calculates a ratio r (=Vob/Vbat) between total voltage Vbat of energy storage unit 20 and measured voltage Vob. In a state where the high-voltage vehicle load including inverter 2 and the chassis ground are ideally insulated from each other (a state where no ground fault current flows), the ratio r is 0.5. Since the resistance values of first resistor R1, second resistor R2, third resistor R3, and fourth resistor R4 are equal, total voltage Vbat of energy storage unit 20 is divided into ¼ by four resistors. Therefore, the ratio r is 0.5 (=2/4). In a case where the calculated ratio r deviates from 0.5 by a predetermined value or more, control unit 13 determines the electric power is leaked between the high-voltage vehicle load including inverter 2 and the chassis ground.

Control unit 13 can detect whether or not the electric power is leaked between a node of any one of the plurality of cells E1 to En in energy storage unit 20 and the chassis ground as follows. In a state where both positive side main relay MRp and negative side main relay MRm are off (open), control unit 13 generates a state where positive side voltage dividing switch SWp is off and negative side voltage dividing switch SWm is on, or a state where positive side voltage dividing switch SWp is on and negative side voltage dividing switch SWm is off. In this state, control unit 13 determines whether or not the electric power is leaked in energy storage unit 20 based on voltage Vob measured by voltage measurement unit 12. When measured voltage Vob indicates a significant value other than 0 V, control unit 13 determines the electric power is leaked in energy storage unit 20. When measured voltage Vob is substantially 0 V, control unit 13 determines that no ground fault has occurred in energy storage unit 20.

Welding detection unit 30 detects a potential difference between a potential of positive wire Lp between positive side main relay MRp and one end of inverter 2 and a potential of negative wire Lm between negative side main relay MRm and the other end of inverter 2, and outputs the potential difference to control unit 13. Control unit 13 detects the welding of positive side main relay MRp or negative side main relay MRm based on the potential difference input from welding detection unit 30. The detection method is similar to the detection method in the case of electrical fault detection device 10 adopting the AC method described above.

By comparing electrical fault detection device 10 adopting the AC method illustrated in FIG. 1 and electrical fault detection device 10 adopting the DC method illustrated in FIG. 3 with each other, the following differences exist between these electrical fault detection devices 10. First, in electrical fault detection device 10 adopting the AC method, when total voltage Vbat of energy storage unit 20 fluctuates, a fluctuation amount is superposed on a waveform of a pulse at measurement point A and hence, it is difficult to accurately determine whether or not the electric power is leaked. In order to prevent a measured pulse voltage from being affected by the fluctuation of a load on a vehicle, countermeasures can be considered such as the insertion of a band pass filter or the determination based on a peak-to-peak value of a measured voltage. However, these countermeasures make the circuit configuration complicated. Electrical fault detection device 10 adopting the DC method, determines whether or not the electric power is leaked based on a ratio between total voltage Vbat of energy storage unit 20 and voltage Vob obtained by dividing total voltage Vbat. Accordingly, the presence or absence of a ground fault can be basically accurately determined even if total voltage Vbat of energy storage unit 20 fluctuates. Although an error due to a synchronization deviation may occur, the error is smaller than a corresponding error which occurs in electrical fault detection device 10 adopting the AC method.

Next, in electrical fault detection device 10 adopting the AC method, it is necessary to appropriately adjust a capacitance of coupling capacitor Cc and a frequency of an applied pulse voltage by capacitances of positive side Y capacitor Cp and negative side Y capacitor Cm. That is, the designing of electrical fault detection device 10 is restricted by positive side Y capacitor Cp and negative side Y capacitor Cm on a vehicle. Specifically, it is necessary to set a frequency of the pulse voltage to a frequency in an appropriate range corresponding to the capacitance of positive side Y capacitor Cp and the capacitance of negative side Y capacitor Cm, and it is also necessary to set the capacitance of coupling capacitor Cc to a capacitance in a range that allows a pulse voltage of the frequency to pass through coupling capacitor Cc. In this case, it is necessary to design the capacitance of coupling capacitor Cc such that the capacitance is sufficiently larger than the capacitance of positive side Y capacitor Cp and the capacitance of negative side Y capacitor Cm.

In electrical fault detection device 10 adopting the DC method, in order to prevent a measured voltage from being affected by the capacitance of positive side Y capacitor Cp and the capacitance of negative side Y capacitor Cm, it is necessary to set a standby time until the measured voltage is stabilized. On the other hand, it is not necessary to change hardware components corresponding to the capacitance of positive side Y capacitor Cp and the capacitance of negative side Y capacitor Cm on a vehicle. Accordingly, the designing of electrical fault detection device 10 is affected smaller as compared with electrical fault detection device 10 adopting the AC method.

Next, in electrical fault detection device 10 adopting the AC method, energy storage unit 20 and electrical fault detection device 10 are galvanically insulated from each other by coupling capacitor Cc. Accordingly, the insulation between energy storage unit 20 and electrical fault detection device 10 can be maintained in a highly insulated state and hence, there is no current that flows into electrical fault detection device 10 from energy storage unit 20. In electrical fault detection device 10 adopting the DC method, to prevent a current from flowing from energy storage unit 20 to voltage dividing circuit 11 when positive side main relay MRp and negative side main relay MRm are off (opened), it is necessary to use a switch (for example, a photo MOS relay) having high insulation performance as positive side voltage dividing switch SWp and negative side voltage dividing switch SWm. A switch having high insulation performance is expensive and hence, the use of such a switch has been a factor which pushes up a cost of electrical fault detection device 10 adopting the DC method.

Next, electrical fault detection device 10 adopting the AC method cannot measure total voltage Vbat of energy storage unit 20 without having an independent total voltage measurement unit that measures total voltage Vbat of energy storage unit 20. In electrical fault detection device 10 adopting a DC method, by controlling positive side voltage dividing switch SWp and negative side voltage dividing switch SWm to an ON state, it is possible to estimate total voltage Vbat of energy storage unit 20 by not providing an independent total voltage measurement unit (see equation 1 described above).

Figure 4:
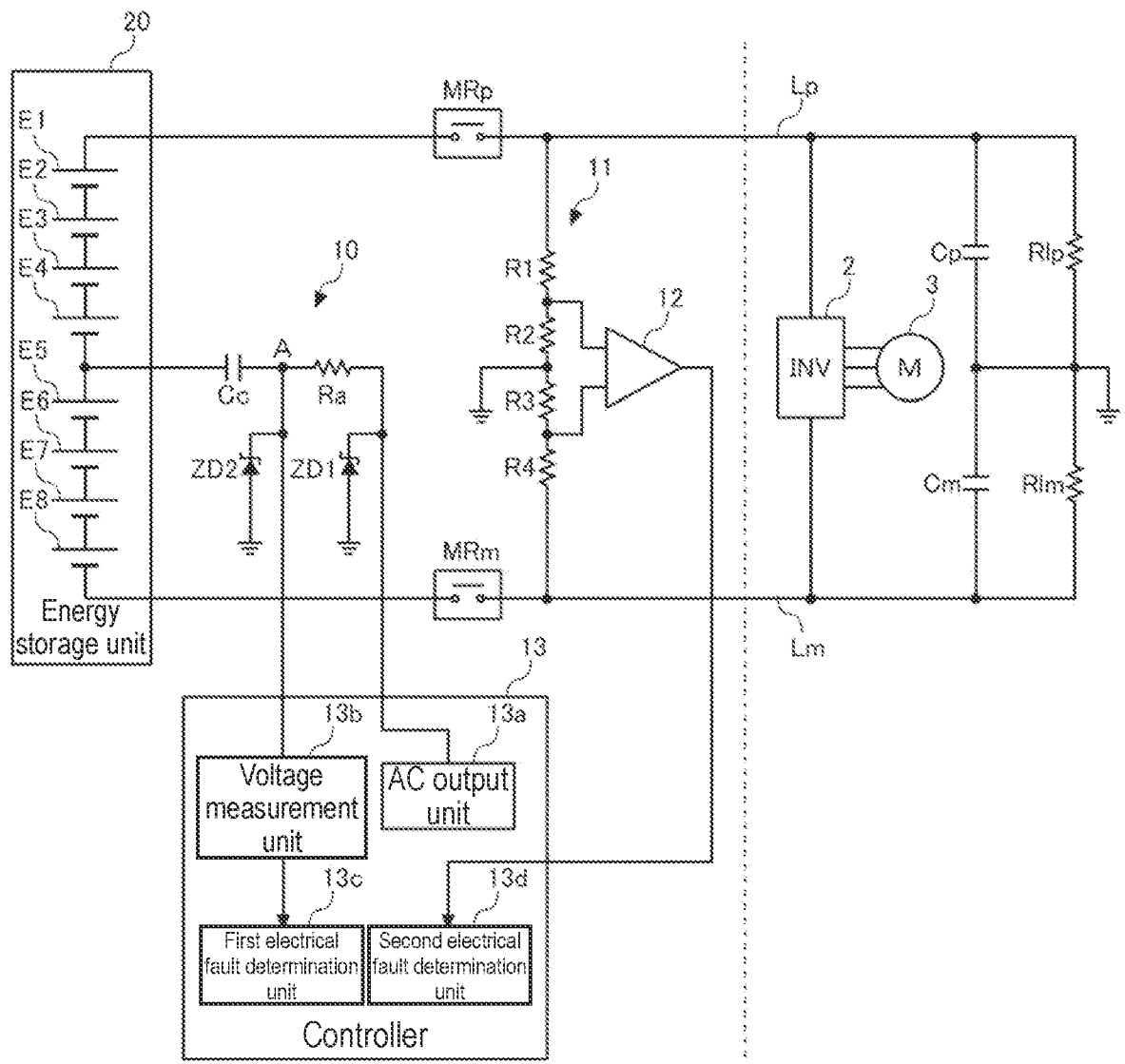
FIG. 4 is a block diagram for describing a configuration of a power supply system including an electrical fault detection device according to an exemplary embodiment of the present invention.

FIG. 4 is a block diagram for describing a configuration of power supply system 5 including electrical fault detection device 10 according to the exemplary embodiment of the present invention. Electrical fault detection device 10 according to the exemplary embodiment is electrical fault detection device 10 which adopts both the AC method and the DC method in combination. Hereinafter, the description is made with respect to differences which make electrical fault detection device 10 according to the exemplary embodiment differ from electrical fault detection device 10 adopting the AC method according to the first comparative example illustrated in FIG. 1 and electrical fault detection device 10 adopting the DC method according to the second comparative example illustrated in FIG. 3.

First, the description is made with respect to the differences which make electrical fault detection device 10 according to the exemplary embodiment differ from electrical fault detection device 10 adopting the DC method illustrated in FIG. 3. In the exemplary embodiment, voltage dividing circuit 11 is connected between positive wire Lm that extends between positive side main relay MRp and one end of inverter 2 and negative wire Lm which extends between negative side main relay MRm and the other end of inverter 2. In the exemplary embodiment, positive side voltage dividing switch SWp and negative side voltage dividing switch SWm are removed from voltage dividing circuit 11. In the exemplary embodiment, welding detection unit 30 is removed.

Next, the description is made with respect to the differences which make electrical fault detection device 10 according to the exemplary embodiment differ from electrical fault detection device 10 adopting the AC method illustrated in FIG. 1. In the exemplary embodiment, a capacitor having small capacitance is used as coupling capacitor Cc. For example, a ceramic capacitor is used in place of an electrolytic capacitor. Since the ceramic capacitor does not have polarity, it is not necessary to consider that the polarity of coupling capacitor Cc is reversed depending on a position where a ground fault occurs in energy storage unit 20. On the other hand, since the electrolytic capacitor has polarity, it is necessary to consider that the polarity of the coupling capacitor Cc is reversed depending on a position where a ground fault occurs in energy storage unit 20. In the case of an electrolytic capacitor, when the polarity is reversed, the capacitance cannot be maintained. In the example illustrated in FIG. 1, in a case where coupling capacitor Cc is connected to a positive electrode or a node of a high voltage among nodes of the plurality of cells E1 to En of energy storage unit 20, when a position where a round fault occurs in energy storage unit 20 is disposed closer to negative electrode than a connection position with coupling capacitor Cc, a possibility that the polarity of coupling capacitor Cc is reversed is increased.

On the other hand, in the case of the ceramic capacitor, it is possible to connect coupling capacitor Cc to any of the plurality of nodes of the plurality of cells E1 to E8 without considering polarity inversion. For example, it is also possible to connect coupling capacitor Cc to an intermediate node of the plurality of cells E1 to E8. For facilitating the understanding of the description, FIG. 4 illustrates an example where energy storage unit 20 includes eight cells E1 to E8 connected in series, and one end of coupling capacitor Cc is connected to the node between fourth cell E4 and fifth cell E5. When coupling capacitor Cc is connected to a middle point of the plurality of cells E1 to E8 connected in series, a withstand voltage of coupling capacitor Cc can be halved as compared with the case where coupling capacitor Cc is connected to a positive electrode or a negative electrode of energy storage unit 20. In this case, the withstand voltage of coupling capacitor Cc can be minimized. As the position where the node to which coupling capacitor Cc is connected is positioned closer to the middle point, the withstand voltage can be set smaller.

Electrical fault detection device 10 according to the exemplary embodiment determines whether or not the electric power is leaked between a high-voltage vehicle load including inverter 2 and a chassis ground by the DC method. Electrical fault detection device 10 determines whether or not the electric power is leaked in energy storage unit 20 is determined by the AC method. The presence or absence of welding between positive side main relay MRp and negative side main relay MRm is determined by the DC method.

When positive side main relay MRp and negative side main relay MRm are in an ON state, second electrical fault determination unit 13$d$ of control unit 13 estimates, as expressed by above equation 1, total voltage Vbat of energy storage unit 20 based on voltage Vob measured by voltage measurement unit 12 and a ratio between a combined resistance value of first resistor R1, second resistor R2, third resistor R3 and fourth resistor R4, and a combined resistance value of second resistor R2 and third resistor R3.

Second electrical fault determination unit 13$d$ calculates a ratio r (=Vob/Vbat) between total voltage Vbat of energy storage unit 20 and measured voltage Vob. When calculated ratio r deviates from 0.5 by a predetermined value or more, second electrical fault determination unit 13d determines whether or not the electric power is leaked between high-voltage vehicle load including inverter 2 and the chassis ground. When calculated ratio r does not deviate from 0.5 by the predetermined value or more, second electrical fault determination unit 13d determines that no ground fault has occurred between high-voltage vehicle load including inverter 2 and chassis ground.

When positive side main relay MRp and negative side main relay MRm are in an ON state, an electrical fault detection function adopting the AC method stops. Specifically, operations of AC output unit 13a, voltage measurement unit 13b, and first electrical fault determination unit 13c of control unit 13 stop.

When positive side main relay MRp and negative side main relay MRm are in an OFF state, first electrical fault determination unit 13c determines the presence or absence of an electrical fault in energy storage unit 20 based on a voltage at measurement point A measured by voltage measurement unit 13b.

Second electrical fault determination unit 13d supplies, when the electrically operated vehicle is stopped (when inverter 2 is stopped), an OFF signal (open signal) to positive side main relay MRp and an ON signal (close signal) to negative side main relay MRm. Second electrical fault determination unit 13d determines the presence or absence of welding of positive side main relay MRp based on voltage Vob measured in this state. When measured voltage Vob indicates a significant value other than 0 V, second electrical fault determination unit 13d determines that positive side main relay MRp is welded. When measured voltage Vob is substantially 0 V, second electrical fault determination unit 13d determines that positive side main relay MRp is not welded.

Second electrical fault determination unit 13d supplies, when the electrically operated vehicle is stopped (when inverter 2 is stopped), an ON signal to positive side main relay MRp and an OFF signal to negative side main relay MRm. Control unit 13 determines the presence or absence of welding of negative side main relay MRm based on voltage Vob measured in this state. When measured voltage Vob indicates a significant value other than 0 V, second electrical fault determination unit 13d determines that negative side main relay MRm is welded. When measured voltage Vob is substantially 0 V, second electrical fault determination unit 13d determines that negative side main relay MRm is not welded.

As described above, according to the present exemplary embodiment, it is possible to suppress a total cost for manufacturing electrical fault detection device 10 by not using an expensive component while securing detection accuracy. Specifically, when positive side main relay MRp and negative side main relay MRm are in an ON state, a ground fault is detected by the DC method. Electrical fault detection device 10 adopting the DC method is minimally affected by the fluctuation of a load of an electrically operated vehicle, and can detect a ground fault with higher accuracy than electrical fault detection device 10 adopting the AC method that is likely to be affected by the fluctuation of a load of a vehicle.

Only when both positive side main relay MRp and negative side main relay MRm are in an OFF state, a ground fault in energy storage unit 20 is detected by the AC method. Thus, the capacitance of coupling capacitor Cc can be determined without being affected by positive side Y capacitor Cp and negative side Y capacitor Cm on a vehicle. Therefore, the capacitance of coupling capacitor Cc can be reduced. In this case, a relatively inexpensive ceramic capacitor can also be adopted as coupling capacitor Cc. Since the ceramic capacitor does not have polarity, it is not necessary to consider polarity inversion of the ceramic capacitor, and the ceramic capacitor can be connected to the middle point of the plurality of cells E1 to E8 connected in series while maintaining detection accuracy.

In the configuration of electrical fault detection device 10 adopting the DC method according to the second comparative example illustrated in FIG. 3, an expensive switch having high insulation performance (for example, a photo MOS relay) is used as positive side voltage dividing switch SWp as well as negative side voltage dividing switch SWm so as to prevent a current from flowing from energy storage unit 20 to voltage dividing circuit 11 when positive side main relay MRp and negative side main relay MRm are in an OFF state.

On the other hand, in electrical fault detection device 10 according to the exemplary embodiment, voltage dividing circuit 11 and voltage measurement unit 12 are disposed closer to inverter 2 than positive side main relay MRp and negative side main relay MRm are. Therefore, even if positive side voltage dividing switch SWp and negative side voltage dividing switch SWm are not provided, it is possible to prevent a current from flowing from energy storage unit 20 to voltage dividing circuit 11 when positive side main relay MRp and negative side main relay MRm are in an OFF state. As described above, in the exemplary embodiment, a manufacturing cost can be greatly reduced by omitting an expensive switch having high insulation performance.

In electrical fault detection device 10 adopting the DC method according to the second comparative example illustrated in FIG. 3, welding detection unit 30 is provided. On the other hand, in electrical fault detection device 10 according to the exemplary embodiment, welding detection unit 30 is removed. In electrical fault detection device 10 adopting the DC method according to the second comparative example, voltage dividing circuit 11 and voltage measurement unit 12 are provided closer to energy storage unit 20 than positive side main relay MRp and negative side main relay MRm are. Therefore, the presence or absence of welding of positive side main relay MRp and negative side main relay MRm cannot be detected by an on/off control of positive side main relay MRp and negative side main relay MRm.

On the other hand, in electrical fault detection device 10 according to the exemplary embodiment, voltage dividing circuit 11 and voltage measurement unit 12 are disposed closer to inverter 2 than positive side main relay MRp and negative side main relay MRm are. Therefore, it is possible to detect the presence or absence of welding of positive side main relay MRp and welding of negative side main relay MRm by an on/off control of positive side main relay MRp and negative side main relay MRm. As described above, according to the exemplary embodiment, welding detection unit 30 can be omitted, and a manufacturing cost can be reduced.

As described above, according to the exemplary embodiment, positive side voltage dividing switch SWp, negative side voltage dividing switch SWm, and welding detection unit 30 can be omitted, and the capacitance of the coupling capacitor Cc can be reduced. Since an expensive component is not used, a total manufacturing cost can be suppressed.

The present invention has been described heretofore based on the exemplary embodiment. However, the above exemplary embodiment is intended to be illustrative only, and the person of ordinary skill in the art will understand that various modifications are possible with respect to the combination of constitutional elements and processing processes in the exemplary embodiment and that such modifications are also within the scope of the present invention.

Figure 5:
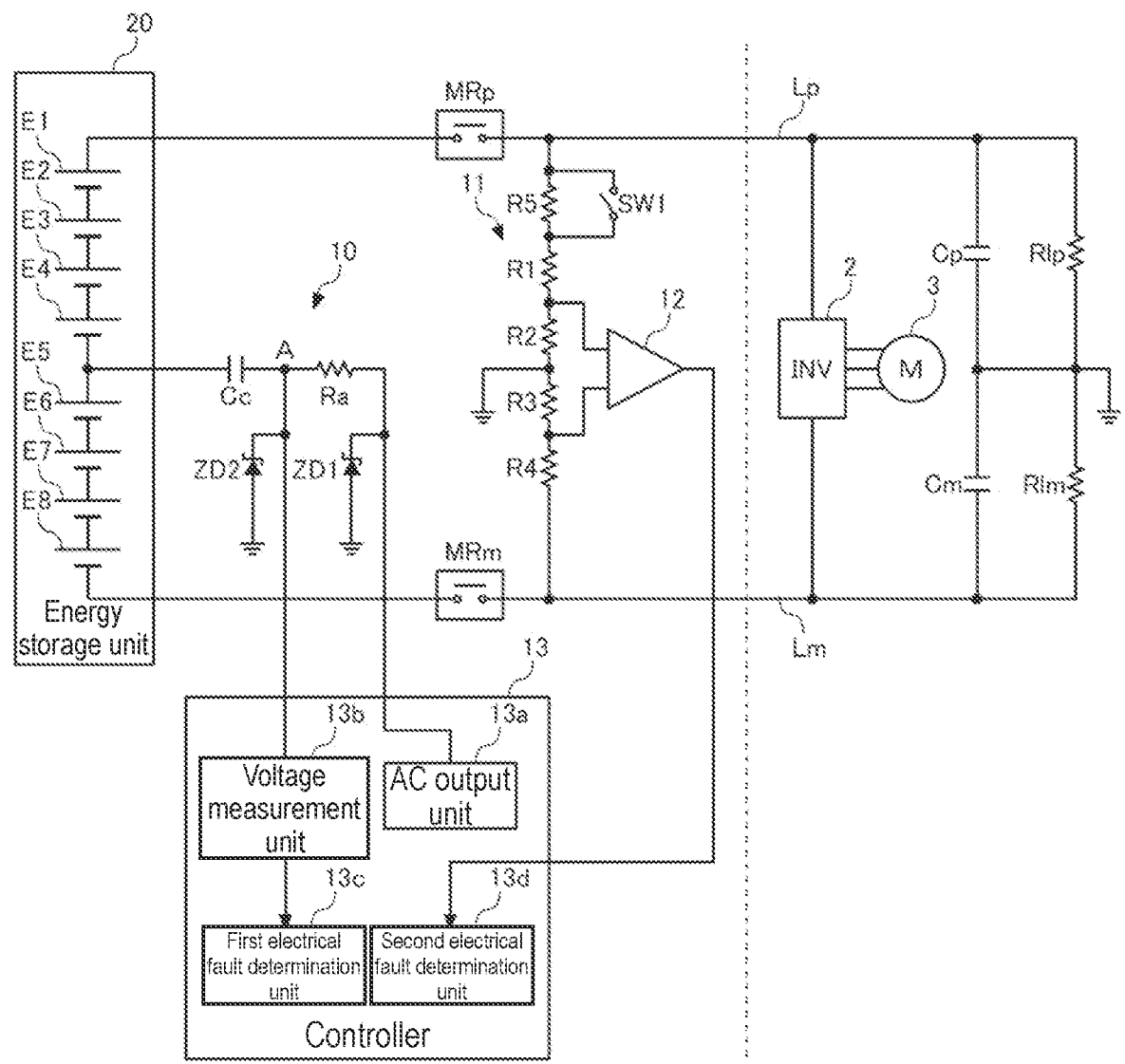
FIG. 5 is a block diagram for describing a configuration of a power supply system including an electrical fault detection device according to a modification of the exemplary embodiment of the present invention.

FIG. 5 is a block diagram for describing a configuration of power supply system 5 including electrical fault detection device 10 according to a modification of the present invention. Electrical fault detection device 10 according to the modification has a configuration in which fifth resistor R5 and bypass switch SW1 are added to voltage dividing circuit 11 of electrical fault detection device 10 illustrated in FIG. 4. Fifth resistor R5 is further connected in series to first resistor R1, second resistor R2, third resistor R3, and fourth resistor R4 connected in series between positive wire Lp and negative wire Lm. Bypass switch SW1 is connected in parallel with fifth resistor R5. Fifth resistor R5 becomes invalid when bypass switch SW1 is in an ON state, and fifth resistor R5 becomes valid when bypass switch SW1 is in an OFF state.

In electrical fault detection device 10 illustrated in FIG. 4, in a case where a ground fault occurs in both between positive wire Lp and a chassis ground and between negative wire Lm and the chassis ground in a mode where positive side electrical fault resistance Rlp and negative side electrical fault resistance Rlm are substantially equal, a ratio r (=Vob/Vbat) becomes a value near 0.5. This is because a combined resistance value on a positive side including positive side electrical fault resistance Rlp and a combined resistance value on a negative side including negative side electrical fault resistance Rlm are balanced.

On the other hand, in the modification, the combined resistance value on the positive side and the combined resistance value on the negative side can be intentionally made unbalanced by turning on bypass switch SW1. As a result, in a mode where positive side electrical fault resistance Rlp and negative side electrical fault resistance Rlm are substantially equal, a ground fault can be detected even in a case where a ground fault occurs both between positive wire Lp and chassis ground and between negative wire Lm and the chassis ground.

In a state where positive side main relay MRp and negative side main relay MRm are off, no current flows from energy storage unit 20 to voltage dividing circuit 11. Accordingly, it is not necessary to use an expensive switch having high insulation performance as bypass switch SW1. For example, an inexpensive metal oxide semiconductor field effect transistor (MOSFET) may be used.

In FIG. 5, a parallel circuit formed of fifth resistor R5 and bypass switch SW1 is inserted above first resistor R1. However, the parallel circuit may be inserted at any position in the series circuit formed of first resistor R1, second resistor R2, third resistor R3, and fourth resistor R4.

Without adding the parallel circuit formed of fifth resistor R5 and bypass switch SW1, respective resistance values of first resistor R1, second resistor R2, third resistor R3, and fourth resistor R4 may be set to different values, and the combined resistance value on a positive side and the combined resistance value on a negative side may be made unbalanced. In any example, a ratio r (=Vob/Vbat) in a state where no ground fault occurs becomes a value other than 0.5.

In the above-described exemplary embodiment, voltage measurement unit 12 measures voltage Vob between a potential at a connecting point (hereinafter, referred to as a first connecting point) between first resistor R1 and second resistor R2 and a potential at a connecting point (hereinafter, referred to as a second connecting point) between third resistor R3 and fourth resistor R4. In this respect, voltage measurement unit 12 may separately measure potential Vop of the first connecting point with respect to a chassis ground and potential Vom of the second connecting point with respect to the chassis ground.

Second electrical fault determination unit 13d estimates potential Vbp of positive wire Lp based on potential Vop of the first connecting point and a ratio between a combined resistance value of first resistor R1 and second resistor R2 and a value of second resistor R2 as expressed in following equation 2.

$$Vbp = (R1+R2)/R2 \cdot Vop \quad \text{(Equation 2)}$$

Second electrical fault determination unit 13d calculates a ratio r (=Vbp/Vbat) between total voltage Vbat of energy storage unit 20 and potential Vbp of positive wire Lp. When the calculated ratio r is larger than 0.5 by a predetermined value or more, second electrical fault determination unit 13d determines that a ground fault has occurred between negative wire Lm and the chassis ground. When the calculated ratio r is smaller than 0.5 by a predetermined value or more, it is determined that a ground fault has occurred between positive wire Lp and the chassis ground. When a ratio r (=Vbm/Vbat) between total voltage Vbat of energy storage unit 20 and potential Vbm of negative wire Lm is used, this relationship is reversed. As described above, in a case where the ratio r (=Vbp/Vbat) on a positive side or the ratio r (=Vbm/Vbat) on a negative side is used, it is also possible to specify whether a ground fault has occurred between positive wire Lp and the chassis ground or between negative wire Lm and the chassis ground.

In the above-described exemplary embodiment, the example which adopts the AC method is described where a rectangular wave pulse signal is applied from AC output unit 13a to coupling capacitor Cc via resistor Ra. In this respect, a sinusoidal signal may be applied to coupling capacitor Cc. First electrical fault determination unit 13c determines whether or not the electric power is leaked based on a degree of rounding of an applied sinusoidal wave signal measured at the measurement point A.

The exemplary embodiment may be specified by the configurations described below.

[Item 1]

Electrical fault detection device (10) mounted on a vehicle that includes: energy storage unit (20) that is mounted on the vehicle in a state where energy storage unit (20) is insulated from the chassis ground of the vehicle and supplies electric power to load (2) in the vehicle; first switch (MRp) that is inserted into positive wire (Lp) to which a positive electrode of energy storage unit (20) and one end of load (2) are connected; and second switch (MRm) that is inserted into negative wire (Lm) to which the negative electrode of energy storage unit (20) and the other end of load (2) are connected.

Electrical fault detection device (10) further includes: coupling capacitor (Cc) that has one end connected to the current path of energy storage unit (20);
  AC output unit (13a) that applies a predetermined AC voltage to the other end of coupling capacitor (Cc) via impedance element (Ra);
  first voltage measurement unit (13b) that measures a voltage at the connecting point between coupling capacitor (Cc) and impedance element (Ra);
  first determination unit (13c) that determines the presence or absence of an electrical fault based on the voltage detected by first voltage measurement unit (13b);

voltage dividing circuit (11) that includes first resistor (R1), second resistor (R2), third resistor (R3), and fourth resistor (R4) connected in series between positive wire (Lp) and negative wire (Lm), voltage dividing circuit (11) having a connecting point between second resistor (R2) and third resistor (R3) and connected to the chassis ground;

second voltage measurement unit (12) that detects a potential at the connecting point between first resistor (R1) and second resistor (R2), a potential at the connecting point between third resistor (R3) and fourth resistor (R4), or a potential difference between the potentials; and second determination unit (13d) that determines the presence or absence of an electrical fault based on the potential or the potential difference detected by second voltage measurement unit (12), and voltage dividing circuit (11) is connected between positive wire (Lp) between first switch (MRp) and one end of load (2) and negative wire (Lm) between second switch (MRm) and the other end of load (2).

According to such a configuration, it is possible to suppress a total cost for manufacturing electrical fault detection device 10 by not using an expensive component while securing a detection accuracy.

[Item 2]

Electrical fault detection device (10) according to item 1, wherein coupling capacitor (Cc) is formed of a ceramic capacitor.

According to such a configuration, a cost of coupling capacitor (Cc) can be reduced.

[Item 3]

Electrical fault detection device (10) according to item 2, wherein energy storage unit (20) includes a plurality of cells (E1 to En) connected in series, and one end of coupling capacitor (Cc) is connected to a middle point of the plurality of cells (E1 to En) connected in series.

According to such a configuration, a capacitor having a low withstand voltage can be used as coupling capacitor (Cc) and hence, a cost of coupling capacitor (Cc) can be reduced.

[Item 4]

Electrical fault detection device (10) according to any one of item 1 to item 3, further includes: fifth resistor (R5) that is further connected in series to first resistor (R1), second resistor (R2), third resistor (R3), and fourth resistor (R4) connected in series; and bypass switch (SW1) connected in parallel with fifth resistor (R5).

With such a configuration, a combined resistance value on a positive side and a combined resistance value on a negative side can be made unbalanced and hence, an electrical fault can be detected even when an electrical fault occurs simultaneously on the positive side and the negative side.

[Item 5]

Electrical fault detection device (10) according to any one of item 1 to item 4, wherein second determination unit (13d) determines the presence or absence of an electrical fault between load (2) in the vehicle and the chassis ground based on a potential or a potential difference detected by second voltage measurement unit (12) when first switch (MRp) and second switch (MRm) are in an ON state.

With such a configuration, it is possible to determine the presence or absence of an electrical fault between load (2) and the chassis ground in a state where electrical fault detection device (10) is minimally affected by the fluctuation of load (2).

[Item 6]

Electrical fault detection device (10) according to any one of item 1 to item 5, wherein first determination unit (13c) determines the presence or absence of an electrical fault in energy storage unit (20) based on a voltage detected by first voltage measurement unit (13b) when first switch (MRp) and second switch (MRm) are in an OFF state.

With such a configuration, the presence or absence of an electrical fault in energy storage unit (20) can be determined without being affected by the Y capacitor on a vehicle side.

[Item 7]

Electrical fault detection device (10) according to any one of item 1 to item 6, wherein first switch (MRp) is formed of a first relay, second switch (MRm) is formed of a second relay, second determination unit (13d) determines the presence or absence of welding of the first relay based on a potential or a potential difference measured by second voltage measurement unit (12) in a state where an OFF signal is supplied to the first relay and an ON signal is supplied to the second relay with load (2) in a stopped state; and second determination unit (13d) determines the presence or absence of welding of the second relay based on a potential or a potential difference measured by second voltage measurement unit (12) in a state where an ON signal is supplied to the first relay and an OFF signal is supplied to the second relay with load (2) in a stopped state.

With such a configuration, it is possible to detect the welding of the first relay and the welding of the second relay without additionally providing a welding detection unit.

[Item 8]

Vehicle power supply system (5) includes:

energy storage unit (20) that is mounted on the vehicle in a state where energy storage unit (20) is insulated from the chassis ground of the vehicle;

first switch (MRp) that is inserted into positive wire (Lp) to which the positive electrode of energy storage unit (20) and one end of load (2) are connected;

second switch (MRm) that is inserted into negative wire (Lm) to which the negative electrode of energy storage unit (20) and the other end of load (2) are connected; and electrical fault detection device (10) according to any one of the item 1 to item 7.

With such a configuration, it is possible to achieve vehicle power supply system (5) which includes electrical fault detection device (10) where a total cost is suppressed by not using an expensive component while securing the detection accuracy.

REFERENCE MARKS IN THE DRAWINGS 2 inverter
3 motor
5 power supply system
10 electrical fault detection device
11 voltage dividing circuit
12 voltage measurement unit
12a positive side differential amplifier
12b negative side differential amplifier
13 control unit
13a AC output unit
13b voltage measurement unit
13c first electrical fault determination unit
13d second electrical fault determination unit 20 energy storage unit
30 welding detection unit
E1 to En cell
Cc coupling capacitor
Ra resistor
ZD1, D2 Zener diode
R1 to R5 resistor
SWp positive side voltage dividing switch
SWm negative side voltage dividing switch
MRp positive side main relay
MRm negative side main relay
Lp positive wire
Lm negative wire
Cp positive side Y capacitor
Cm negative side Y capacitor
Rlp positive side electrical fault resistance
Rlm negative side electrical fault resistance
RLb electrical fault resistance in energy storage unit
SW1 bypass switch

The invention claimed is:

1. An electrical fault detection device that is mounted on a vehicle and includes:
an energy storage unit that is mounted on the vehicle in a state where the energy storage unit is insulated from a chassis ground of the vehicle and supplies electric power to a load in the vehicle;
a first switch that is inserted into a positive wire to which a positive electrode of the energy storage unit and one end of the load are connected; and
a second switch that is inserted into a negative wire to which a negative electrode of the energy storage unit and another end of the load are connected,
the electrical fault detection device comprising:
a coupling capacitor that has one end connected to a current path of the energy storage unit;
an alternating current (AC) output unit that applies a predetermined AC voltage to another end of the coupling capacitor via an impedance element;
a first voltage measurement unit that measures a voltage at a connecting point between the coupling capacitor and the impedance element;
a first determination unit that determines whether or not the electric power is leaked based on a voltage detected by the first voltage measurement unit;
a voltage dividing circuit that includes a first resistor, a second resistor, a third resistor, and a fourth resistor connected in series between the positive wire and the negative wire, the voltage dividing circuit having a connecting point between the second resistor and the third resistor and connected to the chassis ground; a fifth resistor that is further connected in series to the first resistor, the second resistor, the third resistor, and the fourth resistor connected in series; and a bypass switch connected in parallel with the fifth resistor;
a second voltage measurement unit that detects a potential at a connecting point between the first resistor and the second resistor and a potential at a connecting point between the third resistor and the fourth resistor, or a potential difference between the potentials; and
a second determination unit that determines whether or not the electric power is leaked based on the potential or the potential difference detected by the second voltage measurement unit,
wherein the voltage dividing circuit is connected between the positive wire between the first switch and the one end of the load and the negative wire between the second switch and the other end of the load.

2. The electrical fault detection device according to claim 1, wherein the coupling capacitor is composed of a ceramic capacitor.

3. The electrical fault detection device according to claim 2, wherein
the energy storage unit includes a plurality of cells connected in series, and
one end of the coupling capacitor is connected to a middle point of the plurality of cells connected in series.

4. The electrical fault detection device according to claim 1, wherein the second determination unit determines whether or not the electric power is leaked between the load in the vehicle and the chassis ground based on the potential or the potential difference detected by the second voltage measurement unit in a state where the first switch and the second switch are in an ON state.

5. The electrical fault detection device according to claim 1, wherein the first determination unit determines whether or not the electric power is leaked in the energy storage unit based on the voltage detected by the first voltage measurement unit in a state where the first switch and the second switch are in an OFF state.

6. The electrical fault detection device according to claim 1, wherein
the first switch is composed of a first relay,
the second switch is composed of a second relay,
the second determination unit determines whether or not welding of the first relay based on the potential or the potential difference measured by the second voltage measurement unit in a state where an OFF signal is supplied to the first relay and an ON signal is supplied to the second relay with the load in a stopped state, and
the second determination unit determines whether or not welding of the second relay based on the potential or the potential difference measured by the second voltage measurement unit in a state where the ON signal is supplied to the first relay and the OFF signal is supplied to the second relay with the load in a stopped state.

7. The electrical fault detection device according to claim 1, a vehicle power supply system comprising:
the energy storage unit that is mounted on a vehicle in a state where the energy storage unit is insulated from a chassis ground of the vehicle;
the first switch that is inserted into the positive wire to which the positive electrode of the energy storage unit and one end of the load are connected; and
the second switch that is inserted into a negative wire to which a negative electrode of the energy storage unit and another end of the load are connected.

* * * * *